(12) United States Patent
Chen et al.

(10) Patent No.: US 11,521,878 B2
(45) Date of Patent: Dec. 6, 2022

(54) ADSORPTION DEVICE, TRANSFERRING SYSTEM HAVING SAME, AND TRANSFERRING METHOD USING SAME

(71) Applicant: Century Technology (Shenzhen) Corporation Limited, Shenzhen (CN)

(72) Inventors: Po-Liang Chen, New Taipei (TW); Yung-Fu Lin, New Taipei (TW); Hirohisa Tanaka, Neihu (TW); Yasunori Shimada, Neihu (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 645 days.

(21) Appl. No.: 16/547,857

(22) Filed: Aug. 22, 2019

(65) Prior Publication Data
US 2021/0005490 A1    Jan. 7, 2021

(30) Foreign Application Priority Data
Jul. 5, 2019    (CN) .......................... 201910604688.7

(51) Int. Cl.
| | |
|---|---|
| H01L 21/673 | (2006.01) |
| B65G 47/92 | (2006.01) |
| H01L 33/00 | (2010.01) |
| H01L 25/075 | (2006.01) |
| H01L 21/677 | (2006.01) |
| H01L 21/683 | (2006.01) |
| H01L 23/00 | (2006.01) |
| H01L 33/62 | (2010.01) |

(52) U.S. Cl.
CPC ........ H01L 21/67336 (2013.01); B65G 47/92 (2013.01); H01L 21/67709 (2013.01); H01L 21/67721 (2013.01); H01L 21/6835 (2013.01); H01L 24/83 (2013.01); H01L 24/95 (2013.01); H01L 25/0753 (2013.01); H01L 33/00 (2013.01); H01L 33/62 (2013.01); H01L 2221/68368 (2013.01); H01L 2224/75733 (2013.01); H01L 2224/83851 (2013.01); H01L 2224/95144 (2013.01); H01L 2933/0066 (2013.01)

(58) Field of Classification Search
CPC . H01L 2224/95144; H01L 2224/75733; H01L 2224/75734; H01L 2224/95085; H01L 24/95; H01L 21/6835; B81C 3/005; H02N 15/00; H01F 1/0018; H01F 7/0247
See application file for complete search history.

(56) References Cited

U.S. PATENT DOCUMENTS

2006/0223225 A1*  10/2006  Arneson ........... H01L 21/67333
                                                        438/106
2017/0062393 A1*   3/2017  Kim ....................... H01L 24/81
(Continued)

*Primary Examiner* — Alia Sabur
(74) *Attorney, Agent, or Firm* — ScienBiziP, P.C.

(57) ABSTRACT

An adsorption device includes a substrate and a magnetic film on a surface of the substrate. The substrate has magnetic properties and is capable of generating magnetic field. The magnetic film partially covers the surface. The magnetic film generates a magnetic field having a direction that is opposite to a direction of the magnetic field generated by the substrate. Portions of the surface of the substrate not covered by the magnetic film form positions to attract and adsorb target objects, and other portion of the surface of the substrate covered by the magnetic film is not able to attract any target object.

16 Claims, 7 Drawing Sheets

(56) References Cited

U.S. PATENT DOCUMENTS

| | | | |
|---|---|---|---|
| 2017/0229330 A1* | 8/2017 | Tkachenko | H01L 21/82 |
| 2018/0261570 A1* | 9/2018 | Durniak | H01L 24/27 |
| 2019/0015873 A1* | 1/2019 | Durniak | B07C 5/36 |
| 2019/0019717 A1* | 1/2019 | Durniak | H01L 21/6835 |

* cited by examiner

ADSORPTION DEVICE, TRANSFERRING SYSTEM HAVING SAME, AND TRANSFERRING METHOD USING SAME

FIELD

The subject matter herein generally relates to a field of manufacturing display panels, and particularly relates to an adsorption device, a transferring system having the adsorption device, and a transferring method using the adsorption device.

BACKGROUND

In a manufacturing process of a micro light emitting diode (LED) display device, a large number of LEDs are transferred to a substrate having a circuit. A known method of transferring is to adopt electrostatic attraction, that is, the LEDs to be transferred are held to a transferring substrate by static electricity, then the transferring substrate with the LEDs is moved above the substrate, and the static electricity is removed to make the LEDs drop onto the substrate. However, the electrostatic charge may damage the circuit on the substrate.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
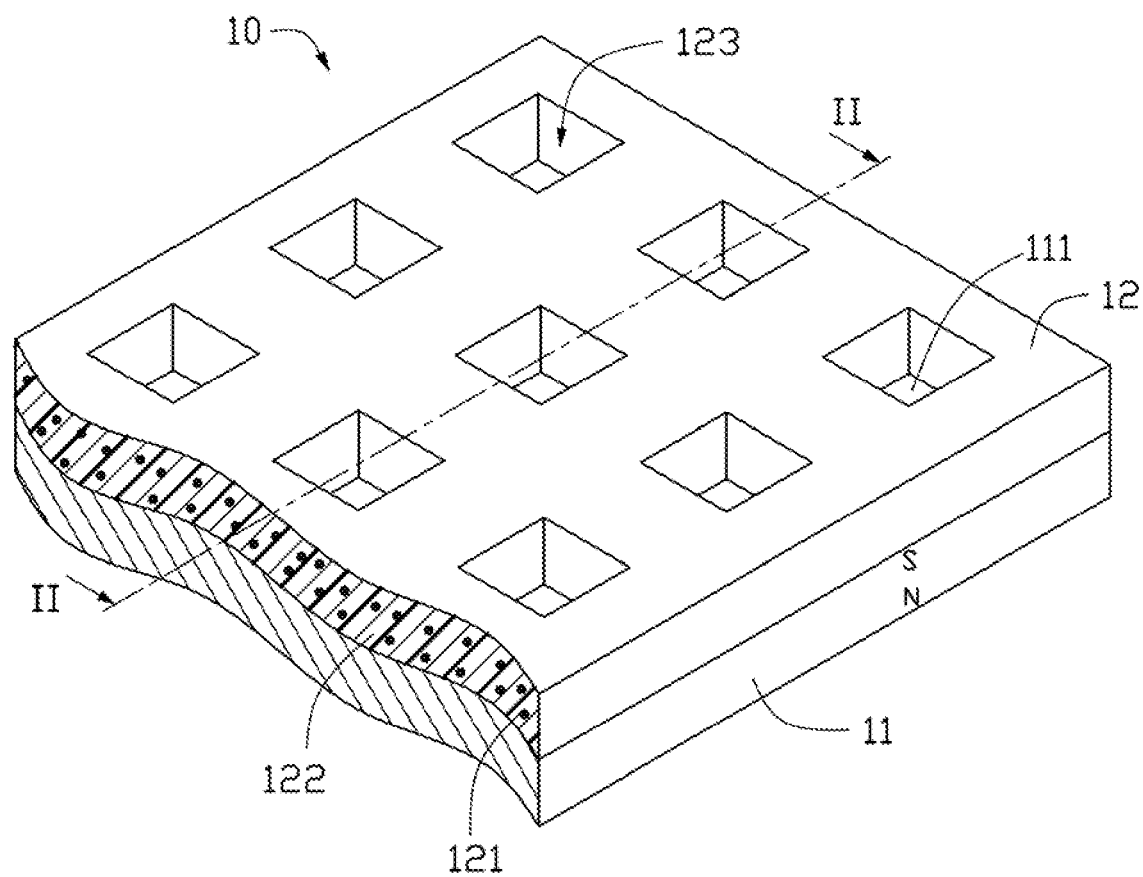
FIG. 1 is an isometric view of an adsorption device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

The adsorption device provided in this embodiment is configured for adsorbing target objects by magnetic force, and the adsorption device is particularly suitable for adsorbing the target object having a small size (micrometer level).

As shown in FIG. 1, the adsorption device 10 includes a substrate 11 and a magnetic film 12 on a surface 111 of the substrate 11, wherein the surface 111 of the substrate 11 is configured to adsorb target objects which are magnetized.

In the present embodiment, the substrate 11 is made of a magnetic material such as ferromagnetic material or ferrimagnetic material. The substrate 11 has two magnetic poles that are a magnetic pole N and a magnetic pole S. For example, one side of the substrate 11 adjacent to the magnetic film 12 is the magnetic pole S, and the other side of the substrate 11 (away from the magnetic film 12) is the magnetic pole N. In other embodiments, the side of the substrate 11 adjacent to the magnetic film 12 is the magnetic pole N, and a side of the substrate 11 away from the magnetic film 12 is the magnetic pole S.

In a modified embodiment, the substrate 11 is not made of a magnetic material, but a magnetic field is generated by applying an electric current under electromagnetic induction. The present disclosure does not limit a manner in which the substrate 11 generates a magnetic field.

Figure 2:
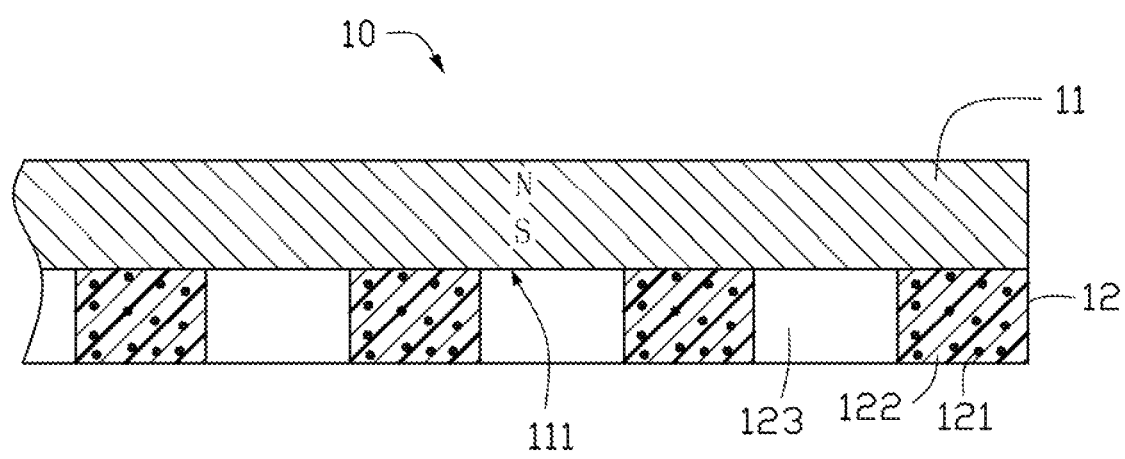
FIG. 2 is a cross-sectional view along line II-II in FIG. 1.

As shown in FIG. 2, the magnetic film 12 is on the surface 111 of the substrate 11 and partially covers the surface 111 of the substrate 11. The magnetic film 12 includes a reverse magnetic substance 121. Since the substrate 11 generates a magnetic field, the reverse magnetic substance 121 is magnetized by the magnetic field according to characteristics of the reverse magnetic substance 121 to form a magnetic pole S and a magnetic pole N. Specifically, the magnetic pole S of the reverse magnetic substance 121 is formed on a side of the reverse magnetic substance 121 adjacent to the substrate 11, and the magnetic pole S of the reverse magnetic substance 121 is formed on a side of the reverse magnetic substance 121 away from the substrate 11. That is, the side of the reverse magnetic substance 121 adjacent to the substrate 11 and the side of the substrate 11 adjacent to the magnetic film 12 have same magnetic poles, and the side of the reverse magnetic substance 121 away from the substrate 11 and the side of the substrate 11 away from the magnetic film 12 have opposite magnetic poles. The reverse magnetic substance 121 generates a magnetic field having a direction opposite to a direction of the magnetic field generated by the substrate 11, the reverse magnetic substance 121 being activated by the magnetic field of the substrate 11. That is, the magnetic film 12 generates a magnetic field having a direction opposite to a direction of the magnetic field generated by the substrate 11.

As shown in FIG. 2, in the embodiment, the reverse magnetic substance 121 is a reverse magnet 121, and the magnetic film 12 includes resin 122 and a plurality of reverse magnets 121 mixed in the resin 122. Each reverse magnet 121 is magnetized by the substrate 11 and generates a magnetic field having a direction opposite to a direction of the magnetic field of the substrate 11.

As shown in FIG. 1 and FIG. 2, a plurality of through holes 123 is defined in the magnetic film 12 and portions of the surface 111 are exposed by the through holes 123. As described above, the magnetic film 12 generates a magnetic field having the direction opposite to the direction of the magnetic field of the substrate 11, thus, a portion of the surface 111 that is covered by the magnetic film 12 cannot attract and adsorb any target object by magnetic force because the magnetic field generated by the substrate 11 and the magnetic field generated by the magnetic film 12 offset each other. The portions of the surface 111 not covered by the magnetic film 12 are capable of attracting and adsorbing target objects. The magnetic field of the portion of the surface 111 of the substrate 11 covered by the magnetic film 12 is exactly offset by the magnetic field generated by the magnetic film 12, which depends on magnitudes of the magnetic fields of the substrate 11 and the magnetic film 12, and sizes and number of the reverse magnets 121 in the magnetic film 12.

In this embodiment, the through holes 123 are arranged in an array. In other embodiments, the through holes 123 may be arranged in other ways, for example, in a row/column. An inner diameter of each through hole 123 is determined by a size of the target object to be adsorbed by the adsorption device 10. The portions of the surface 111 of the substrate 11 aligning with each through hole 123 are configured for adsorbing a target object, and the inner diameter of each through hole 123 is greater than the size of the target object to be adsorbed by the adsorption device 10.

The adsorption device 10 may be formed by forming a magnetic film 12 completely covering the surface 111 on the substrate 11, and etching (for example, laser etching) the magnetic film 12 to form the plurality of through holes 123.

Figure 3:
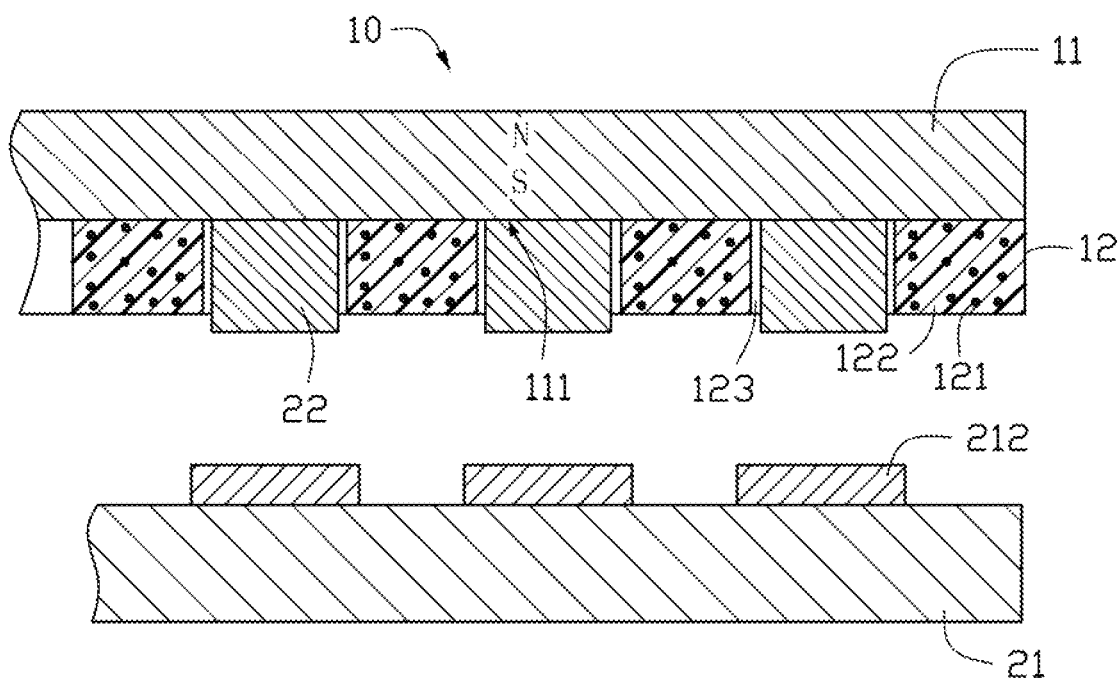
FIG. 3 is a cross-sectional view of a transferring system according to an embodiment of the present disclosure.

As shown in FIG. 3, a transferring system 20 includes the adsorption device 10 and a target substrate 21. The transferring system 20 is used to transfer a large number of the light-emitting diodes (LEDs) 22 in one operation during a manufacturing process of a display panel.

Figure 4:
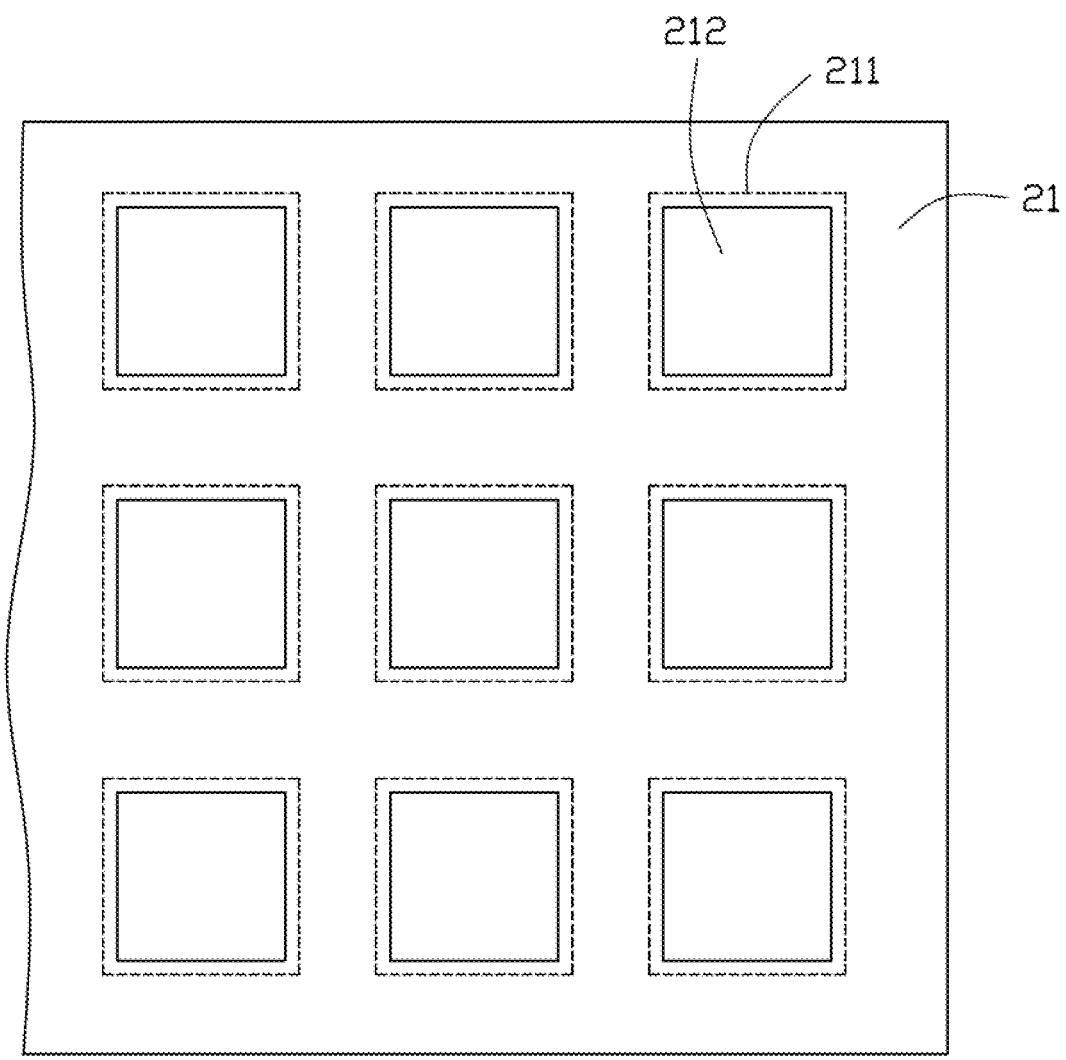
FIG. 4 is a plan view showing the transferring system of FIG. 3.

In this embodiment, the target substrate 21 is an active substrate/array substrate of a display panel. As shown in FIG. 4, the target substrate 21 defines a plurality of pixel regions 211. During an operation of the transferring system 20, the pixel regions 211 correspond to portions of the surface 111 of the substrate 11 that are not covered by the magnetic film 12, each pixel region 211 aligns with one of the through holes 123. Specifically, the pixel regions 211 are arranged in an array, and the through holes 123 are also arranged in an array. A spot of anisotropic conductive adhesive 212 is positioned in each one pixel region 211. Thus, the spots of anisotropic conductive adhesive 212 are also arranged in an array.

Figure 5:
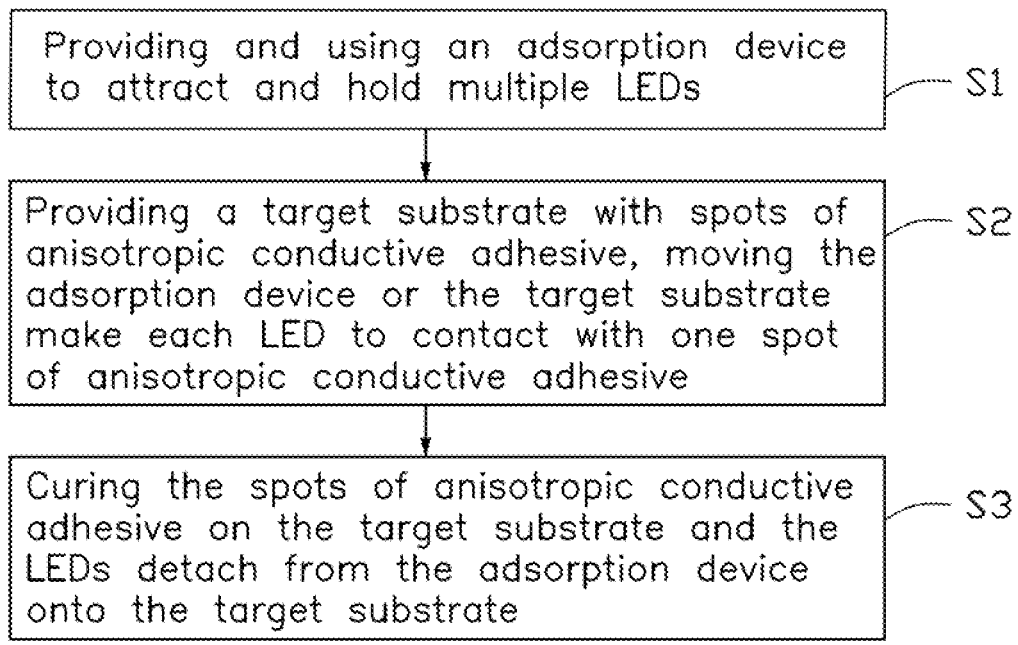
FIG. 5 is a flow chart showing a transferring method using the adsorption device.

FIG. 5 illustrates a flowchart of a transferring method using the transferring system 20. The example method is provided by way of example, as there are a variety of ways to carry out the method. Each block shown in FIG. 5 represents one or more processes, methods, or subroutines, carried out in the exemplary method. Furthermore, the illustrated order of blocks is by example only and the order of the blocks can change. The exemplary method can begin at block 51 according to the present disclosure. Depending on the embodiment, additional steps can be added, others removed, and the ordering of the steps can be changed.

At block 51, the above described adsorption device is provided together with multiple LEDs.

The LED 22 can be, for example, a mini LED, a micro LED, and a conventional size LED. The mini LED described herein refers to a sub-millimeter LED having a size of about 100 μm to 200 μm or more, a micro LED refers to an LED having a size of 100 μm or less.

As shown in FIG. 3, the adsorption device 10 includes the substrate 11 and the magnetic film 12. The magnetic film 12 defines the through holes 123 to expose the surface 111 of the substrate 11. The surface 111 of the substrate 11 having the magnetic film 12 faces the LEDs 22. Each LED 22 is made of a material having magnetic properties or contains magnetic particles. Each LED 22 has magnetic property opposite to magnetic properties of the portions of the surface 111 of the substrates 11 which are exposed by the through holes 123. Each LED 22 is attracted toward the adsorption device 10 by the magnetic force, and is attracted by the substrate 11. The surface 111 of the substrate 11 adsorbs one LED 22 corresponding to a position of each through hole 123. The adsorption device 10 can adsorb many LEDs 22 at one single time. A number of LED 22 that can be adsorbed by the device 10 can be more than ten thousand.

At block S2, a target substrate with a plurality of spots of anisotropic conductive adhesive on a surface thereof is provided, the adsorption device or the target substrate is moved to place each LED adsorbed by the adsorption device in contact with one spot of anisotropic conductive adhesive.

Figure 6:
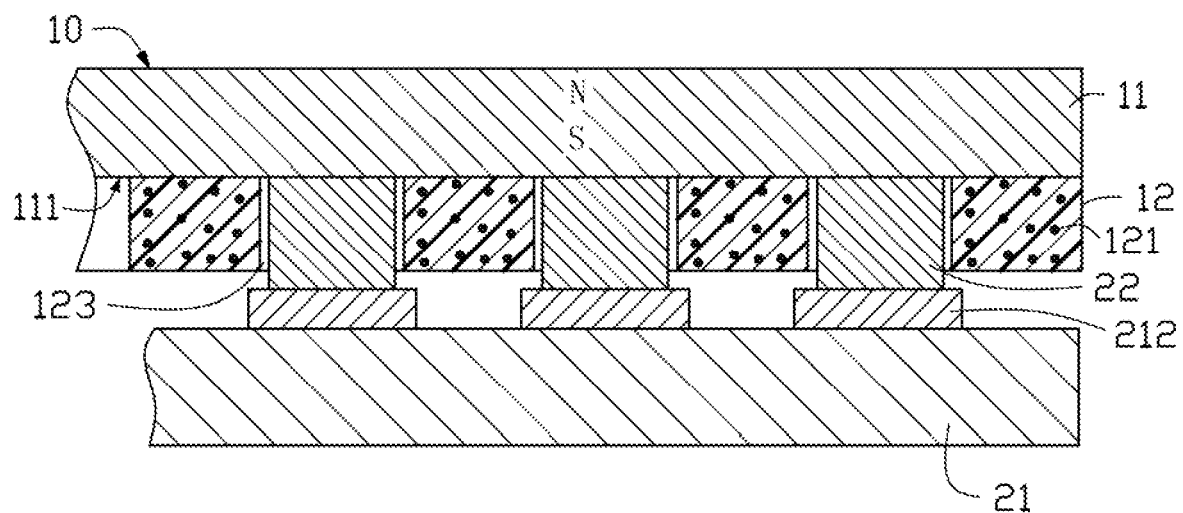
FIG. 6 is a cross-sectional view showing the transferring system in a working state.

As shown in FIG. 6, the adsorption device 10 is moved above the target substrate 21 or the target substrate 21 is moved under the adsorption device 10, and the LEDs 22 adsorbed by the adsorption device 10 are in one-to-one correspondence with the spots of anisotropic conductive adhesive 212 on the target substrate 21. Each LED 22 contacts one spot of anisotropic conductive adhesive 212.

At block S3, the anisotropic conductive adhesive on the target substrate is cured, and the multiple LEDs will be detached from the adsorption device to the target substrate when the adsorption device is removed.

Figure 7:
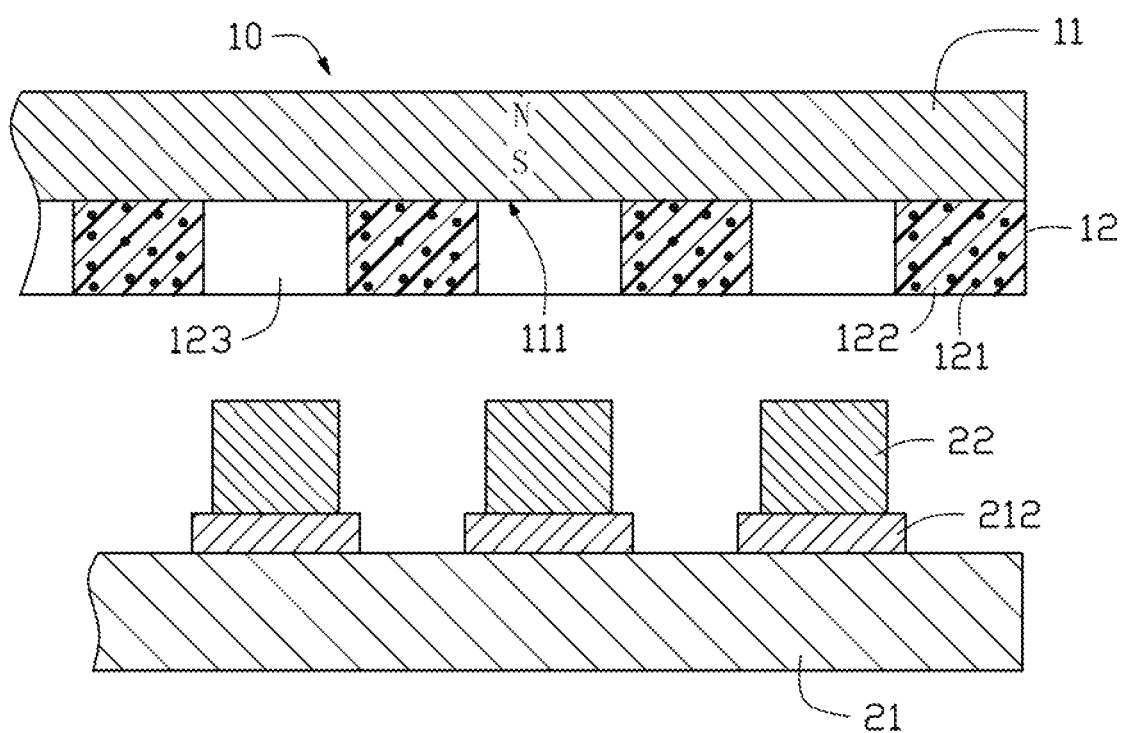
FIG. 7 is another cross-sectional view showing the transferring system in a working state.

The anisotropic conductive adhesive 212 is thermally cured or UV-cured so that the LEDs 22 are adhered to the spots of anisotropic conductive adhesive 212 in one-to-one correspondence. As shown in FIG. 7, an adhesion force between the LED 22 and the anisotropic conductive adhesive 212 is greater than the magnetic attraction of the LED 22 to the adsorption device 10. When the adsorption device 10 is moved away from the target substrate 21, the LED 22 separates from the adsorption device 10 and remains fixed to the target substrate 21.

As described above, a large number of LEDs 42 can be transferred onto the target substrate 41 at one time. In particular, when the size of the LED 22 is very small (such as mini LEDs and Micro LEDs), the above transferring system 20 improves manufacturing efficiency of the display panel.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An adsorption device, comprising:
  a substrate, the substrate capable of generating magnetic field; and
  a magnetic film on a surface of the substrate and partially covering the surface, wherein when the substrate is generating a magnetic field, the magnetic film generates a magnetic field having a direction that is opposite to a direction of the magnetic field generated by the substrate;
  wherein portions of the surface of the substrate not covered by the magnetic film form positions configured to attract and adsorb target objects which are magnetized, and the magnetic field generated by the substrate and the magnetic field generated by the magnetic film are configured to offset each other such that other portion of the surface of the substrate covered by the magnetic film can not attract any target object by magnetic force.

2. The adsorption device of claim 1, wherein the magnetic film comprises reverse magnetic substance, the reverse magnetic substance generates a magnetic field having a direction opposite to a direction of the magnetic field generated by the substrate.

3. The adsorption device of claim 2, wherein the reverse magnetic substance is reverse magnets.

4. The adsorption device of claim 3, wherein the magnetic film comprises resin and a plurality of reverse magnets mixed in the resin.

5. The adsorption device of claim 1, wherein the magnetic film defines a plurality of through holes to expose the surface of the substrate; the portions of the surface of the substrate aligning with the plurality of through holes forms a plurality of adsorption positions configured to attract target objects.

6. The adsorption device of claim 5, wherein the target objects are light emitting diodes (LEDs).

7. The adsorption device of claim 1, wherein the substrate is made of a magnetic material.

8. A transferring system, comprising:
   a target substrate, a plurality of spots of anisotropic conductive adhesive on the target substrate; and
   an adsorption device, the adsorption device comprising:
      a substrate, the substrate having magnetic property and being capable of generating magnetic field; and
      a magnetic film on a surface of the substrate and partially covering the surface, wherein when the substrate is generating a magnetic field, the magnetic film generates a magnetic field having a direction that is opposite to a direction of the magnetic field generated by the substrate;
   wherein portions of the surface of the substrate not covered by the magnetic film form positions configured to attract and adsorb target objects which are magnetized, and the magnetic field generated by the substrate and the magnetic field generated by the magnetic film are configured to offset each other such that other portion of the surface of the substrate covered by the magnetic film can not attract and adsorb any target object by magnetic force.

9. The transferring system of claim 8, wherein the magnetic film comprises reverse magnetic substance, the reverse magnetic substance generates a magnetic field having a direction opposite to a direction of the magnetic field generated by the substrate.

10. The transferring system of claim 9, wherein the reverse magnetic substance is reverse magnets.

11. The transferring system of claim 10, wherein the magnetic film comprises resin and a plurality of reverse magnets mixed in the resin.

12. The transferring system of claim 8, wherein the magnetic film defines a plurality of through holes to expose the surface of the substrate; the portions of the surface of the substrate aligning with the plurality of through holes forms a plurality of adsorption positions to attract target objects.

13. The transferring system of claim 12, wherein the target objects are light emitting diodes (LEDs).

14. The transferring system of claim 8, wherein the substrate is made of a magnetic material.

15. A transferring method, comprising:
   providing an adsorption device, the adsorption device comprising:
      a substrate, the substrate having magnetic property and being capable of generating magnetic field; and
      a magnetic film on a surface of the substrate and partially covering the surface, wherein when the substrate is generating a magnetic field, the magnetic film generates a magnetic field having a direction that is opposite to a direction of the magnetic field generated by the substrate;
   wherein portions of the surface of the substrate not covered by the magnetic film form positions configured to attract and adsorb light emitting diodes (LEDs) which are magnetized, and the magnetic field generated by the substrate and the magnetic field generated by the magnetic film are configured to offset each other such that other portion of the surface of the substrate covered by the magnetic film can not attract and adsorb any LED by magnetic force;
   using the adsorption device to attract and hold a plurality of LEDs by portions of the surface of the substrate not covered by the magnetic film;
   providing a target substrate with a plurality of spots of anisotropic conductive adhesive, the plurality of spots of anisotropic conductive adhesive on a surface of the target substrate;
   moving the adsorption device or the target substrate make each of the plurality of LEDs adsorbed by the adsorption device to contact with one of the plurality of spots of anisotropic conductive adhesive; and
   curing the plurality of spots of anisotropic conductive adhesive on the target substrate and the plurality of LEDs detach from the adsorption device onto the target substrate.

16. The transferring method of claim 15, wherein each of the plurality of LEDs is made of a material having magnetic properties or contains magnetic particles.

* * * * *